United States Patent
Sharp et al.

(10) Patent No.: US 10,677,825 B2
(45) Date of Patent: Jun. 9, 2020

(54) SYSTEM AND METHOD FOR DETECTING THEFT OF ELECTRICITY USING METER DATA DISAGGREGATION

(71) Applicant: Cooper Technologies Company, Houston, TX (US)

(72) Inventors: Michael McClintock Sharp, Plymouth, MN (US); Perry Lynn Baesler, Maple Grove, MN (US); Jay Edward Tolle, St. Louis Park, MN (US); Aaron Thomas Beckius, Minnetonka, MN (US)

(73) Assignee: Eaton Intelligent Power Limited, Dublin (IE)

( * ) Notice: Subject to any disclaimer, the term of this patent is extended or adjusted under 35 U.S.C. 154(b) by 199 days.

(21) Appl. No.: 15/722,136

(22) Filed: Oct. 2, 2017

(65) Prior Publication Data

US 2019/0101576 A1    Apr. 4, 2019

(51) Int. Cl.
*G01R 22/06* (2006.01)
*G01F 15/00* (2006.01)
*G01F 25/00* (2006.01)
*G01R 21/133* (2006.01)
*G01D 4/00* (2006.01)

(52) U.S. Cl.
CPC ......... *G01R 22/066* (2013.01); *G01F 15/007* (2013.01); *G01D 4/004* (2013.01); *G01F 25/003* (2013.01); *G01R 21/133* (2013.01)

(58) Field of Classification Search
CPC ... G01R 22/066; G01R 21/133; G01F 15/007; G01F 25/003; G01D 4/004
See application file for complete search history.

(56) References Cited

U.S. PATENT DOCUMENTS

2006/0091877 A1* 5/2006 Robinson ............. G01R 21/133
324/76.11
2008/0109387 A1* 5/2008 Deaver ............ G01R 19/16547
705/412

(Continued)

FOREIGN PATENT DOCUMENTS

EP    2290328 A1    3/2011

OTHER PUBLICATIONS

Armel, "Energy Disaggregation," Precourt Energy Efficiency Center, Stanford, Dec. 2011, pp. 1-21.

*Primary Examiner* — Christopher P McAndrew
*Assistant Examiner* — Zannatul Ferdous
(74) *Attorney, Agent, or Firm* — Ziolkowski Patent Solutions Group, SC

(57) ABSTRACT

A system for detecting theft of electricity from a utility includes a controller configured to receive electricity readings from a metering device configured to sense electricity flowing therethrough to a primary load, disaggregate the electricity readings from the metering device into electricity readings for sub-loads identified within the primary load, and compare the disaggregated electricity readings for the identified sub-loads to expected electricity readings for each identified sub-load. The controller is also configured to calculate a level of interference with an electrical path through the metering device based on an extent that the disaggregated electricity readings deviate from the expected electricity readings and output to the utility the level of interference with the electrical path.

20 Claims, 2 Drawing Sheets

(56) References Cited

U.S. PATENT DOCUMENTS

| | | | |
|---|---|---|---|
| 2009/0293120 A1* | 11/2009 | Feng | G08B 13/1427 726/21 |
| 2009/0315535 A1* | 12/2009 | Lee, Jr. | G01R 22/066 324/110 |
| 2012/0062210 A1* | 3/2012 | Veillette | H04Q 9/00 324/110 |
| 2014/0358838 A1 | 12/2014 | Dhurandhar et al. | |
| 2015/0012147 A1* | 1/2015 | Haghighat-Kashani | G06Q 30/02 700/291 |
| 2015/0276890 A1* | 10/2015 | Turner | G01R 31/40 324/764.01 |
| 2015/0323344 A1 | 11/2015 | Arlitt et al. | |
| 2016/0320431 A1* | 11/2016 | Driscoll | G01R 11/24 |
| 2017/0082665 A1 | 3/2017 | Bandyopadhyay et al. | |

\* cited by examiner

SYSTEM AND METHOD FOR DETECTING THEFT OF ELECTRICITY USING METER DATA DISAGGREGATION

BACKGROUND OF THE INVENTION

The present invention relates generally to electricity theft detection and, more particularly, to a system and method of detecting theft of electricity using advanced metering infrastructure (AMI) including meters monitoring and aggregating electrical data in a power distribution system.

Theft of electricity is a serious problem worldwide. Electricity theft has become the third largest form of theft behind credit card data theft and automobile theft. In 2014, worldwide losses as a result of stolen electricity amounted to 89.3 billion dollars. Electricity theft losses in the United States amount to approximately 6 billion dollars every year. Approximately 80% of electricity theft is residential, with the remaining 20% of electricity theft being commercial. Electricity theft is one of the most prominent, if not the most prominent, form of non-technical losses. Non-technical losses are caused by actions external to a utility's power distribution system or caused by loads and/or conditions not taken into account in the computations for the power distribution system technical losses (naturally occurring or internal losses from power dissipation).

A variety of methods are used by utility customers to steal electricity from electric utilities. Many of the methods involve tampering with the primary meter that reads the electricity flowing into the residential or commercial load. One way to tamper with older meters is to pull out the meter that connects the electrical path from the utility to the electrical path into the property and put that meter back in upside down. Thus, the line side of the meter and the load side of the meter would be reversed, and the meter would record any measurements taken as a reverse flow of electricity. In other words, the meter would read that electricity is being provided to the utility from the load. Another way utility customers tamper with their utility meters is to put a shunt in the base of their meter to create a parallel electrical path that will not be monitored. Yet another common meter tampering method is to put one or more magnets on the meter. The magnets cause the meter to rotate slower than intended, resulting in a lower electric bill.

Utility customers also steal electricity from electrical utilities by tampering with the electrical lines leading into the property. Many utility customers bypass the meter within the meter housing by connecting a wire at the line side or input of the meter directly to the load side or output of the meter. In addition, some customers bypass their meters simply by tapping into an overhead power line on or near the property using a fish hook or similar device to bypass the meter. Other customers dig up underground power lines on their property and tap directly into those lines.

In any case, tampering with electric utility meters or power lines is dangerous and illegal. The traditional methods of detecting electricity theft include going to a customer's property to look for physical indications of tampering, gathering leads reported by the public, and investigating neighbors and relatives of customers found to be tampering to determine if they are also tampering. However, those methods are time consuming and expensive, so electric utilities developed methods of remotely detecting tampering. Several methods include monitoring meters for reverse flow events; power outages and blinks; load side voltages upon disconnecting power; magnetic detection using a Hall effect switch or a similar device; vibration or tilting of the meter; meter cover removal; and incorrect polyphase wiring. Further, transformers that feed primary meters electrically downstream therefrom may also be monitored so that the electricity or power readings at the transformer may be compared against the aggregated usage reported by the meters.

In addition to the above, substation feeder metering and AMI data may be incorporated into a power distribution model for the electric utility in order to determine the feeders with the greatest non-technical loss. Also, changes in current flow patterns may be detected before using thermal imaging to find overloaded transformers. Data analytics can be used to locate large spikes or drop offs from historical usage patterns at homes or commercial buildings. The data analytics can account for weather patterns, billing/payment information, comparisons to neighborhood consumption patterns, transformer to aggregate load comparisons, and various other factors.

While the above methods may be helpful in determining whether a customer is stealing electricity, those methods cannot perfectly determine whether electricity theft is occurring. None of the methods take advantage of every indicator of electricity theft based on the data collected by various meters within a power distribution system. For example, none of the above methods identify and monitor components downstream from the primary meter for indications of theft. In addition, the above methods only provide raw data that must be interpreted by the utility in order to determine how likely it is that electricity is being stolen by a customer. Interpretation of that raw data is time consuming and may not provide an indication of electricity theft or may provide a false positive indication of a threat when viewed in isolation, depending on various factors. The utility may have to send someone to investigate, even if there is a low likelihood of theft.

It would therefore be desirable to provide a system and method for electricity theft detection that take advantage of the electrical data aggregated by various meters monitoring loads within a power distribution system and that indicate the likelihood of electrical theft by an electric utility customer.

BRIEF DESCRIPTION OF THE INVENTION

Embodiments of the present invention provide a system and method for electricity theft detection in a power distribution system by disaggregating electrical data sensed by a meter monitoring electricity usage and demand of a primary load of a utility customer to determine electricity usage and demand for secondary loads downstream from the primary load, determining whether there is a discrepancy between the disaggregated electrical data for the secondary loads and expected electrical data for the secondary loads, and indicating the probability that the utility customer has been stealing electricity.

In accordance with one aspect of the invention, a system for detecting theft of electricity from a utility includes a controller configured to receive electricity readings from a metering device configured to sense electricity flowing therethrough to a primary load, disaggregate the electricity readings from the metering device into electricity readings for sub-loads identified within the primary load, and compare the disaggregated electricity readings for the identified sub-loads to expected electricity readings for each identified sub-load. The controller is also configured to calculate a level of interference with an electrical path through the metering device based on an extent that the disaggregated electricity readings deviate from the expected electricity readings and output to the utility the level of interference with the electrical path.

In accordance with another aspect of the invention, a method of detecting theft of electricity includes acquiring electrical data for a primary load using a primary meter, transmitting the electrical data from the primary meter to a controller, and disaggregating the electrical data with the controller to identify secondary loads present within the primary load and to separate the electrical data corresponding to each secondary load. The method further includes analyzing the disaggregated electrical data with the controller to detect if the disaggregated electrical data for any of the secondary loads conflicts with anticipated electrical data corresponding to the types of secondary loads identified. In addition, the method includes assessing with the controller an extent of tampering with an electrical line through the primary meter to the primary load based on the analysis and outputting the extent of the tampering with the electrical line to a display.

In accordance with yet another aspect of the invention, a power system having electrical theft detection capabilities includes a primary meter configured to measure a flow of electricity through an electrical path from an electric utility to a primary load and a control system for detecting theft of electricity. The control system configured to retrieve the electricity flow measurements of the primary meter and identify secondary loads within the primary load by disaggregating the electricity flow measurements of the primary meter. The control system is additionally configured to determine electricity flow measurements for each secondary load using the disaggregated electricity flow measurements and compare the disaggregated electricity flow measurements for each secondary load to expected electricity flow measurements based on secondary load type. Furthermore, the control system is configured to calculate a percentage of electricity that has bypassed the primary meter before being delivered to the primary load based on the comparison of the disaggregated secondary load electricity flow measurements to the expected electricity flow measurements and display the percentage on a graphical user interface.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention relate to a system and method for detecting electricity theft in a power distribution system by disaggregating electricity usage and/or demand data from a primary meter for a residential or commercial primary load to detect secondary loads within the primary load and to determine how much electricity each secondary load is using and/or demanding. The disaggregated electricity data for each secondary load is then compared to expected values based on the type of secondary loads, type of primary load service, time of day, etc. If a significant difference is present between the actual disaggregated data for at least one of the secondary loads and the expected data for that secondary load, an indication of tampering or that the primary meter has been partially bypassed is output to a GUI at the electric utility that owns the power distribution system. The indication of tampering may be displayed as a tampering or bypass percentage or coefficient.

Figure 1:
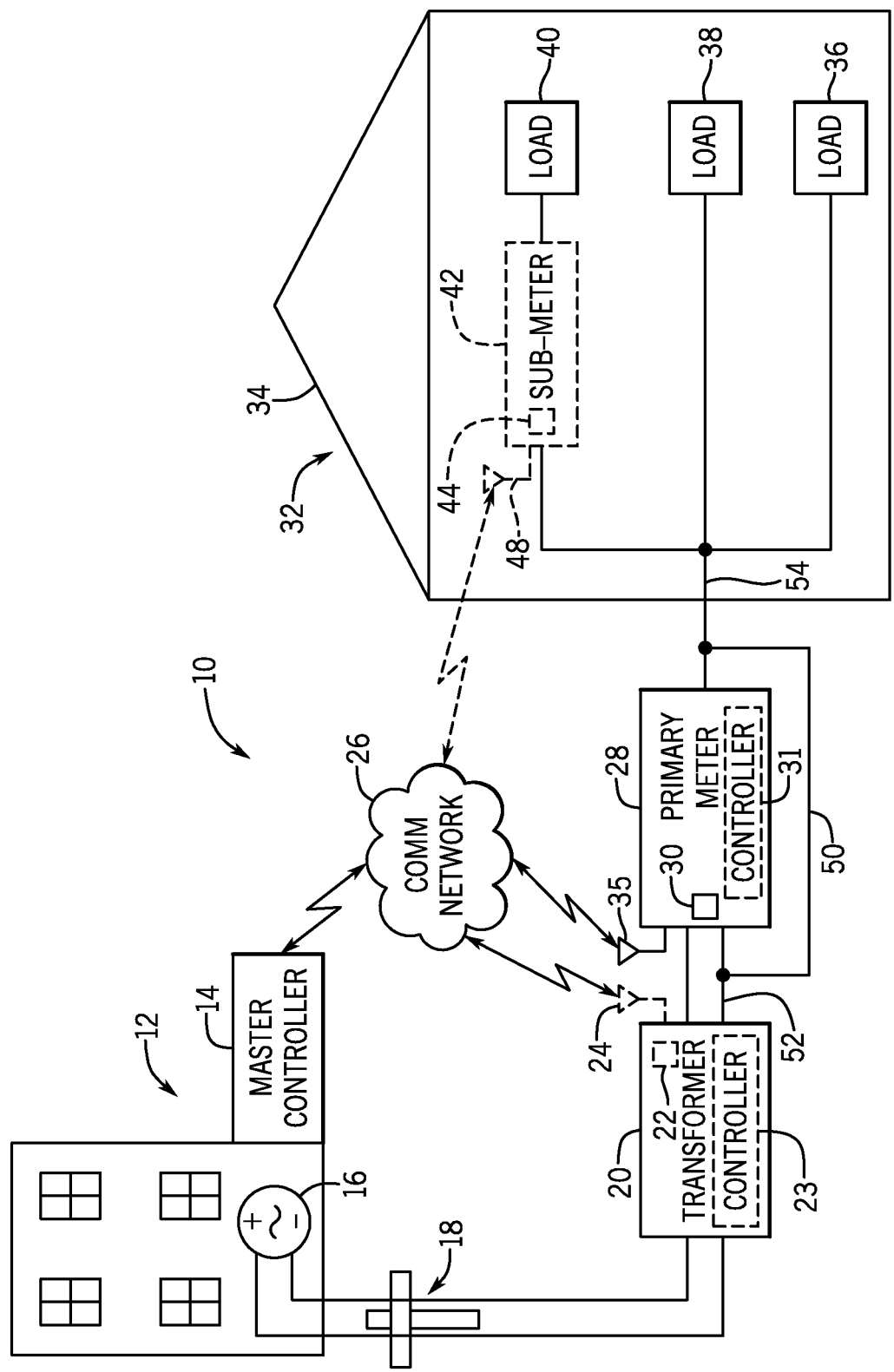
FIG. 1 is a diagram of a power distribution system including a system for electricity theft detection, according to an embodiment of the invention.

Referring to FIG. 1, a diagram of an electrical or power distribution system 10 of an electric utility is illustrated, according to an embodiment of the invention. Power distribution system 10 includes a master station 12 having a master controller or control system 14. However, in various embodiments, the controller 14 is cloud-based or remote from master station 14 at another utility location or at a third party. Master station 12 further includes an electrical power source 16 having one or more power-generating facilities such as, for example, fossil fuel, hydro-electric, and nuclear power plants. Power distribution system 10 also includes a power distribution network 18 electrically connecting station 12 to a transformer 20 for distributing electricity produced by power source 16 to various loads of electrical system 10. Optionally, transformer 20 may be a smart transformer that includes a meter or sensor 22 for measuring or sensing the amount of electricity flowing therethrough and used by customers of the utility. Transformer 20 may also optionally include a controller or control system 23 and a transceiver 24 for sending electricity flow measurements to and receiving commands from controller 14 over a long-haul communications network 26 formed therebetween.

Long-haul communications network 26 may include a wireless network, as depicted in FIG. 1, or a wired network. As such, long-haul communications network 26 may use wired or wireless communications, telephonic communications, Internet Protocol-based communications, satellite system-based communications, and any other type of communications useful for communicating with the various components of electrical system 10. Examples of such communications systems includes ZigBee®, wireless mesh network, Wi-Fi, wireless point-to-multipoint tower-based, fiber, cellular, and Power Line Carrier. Long-haul communications network 26 generally has two-way communications abilities, which allow controller 14 to both send commands to and receive data from the various components of electrical system 10.

Transformer 20 delivers electricity to a primary electricity or power meter or metering device 28 having a sensor 30 for measuring or sensing the amount of electricity flowing therethrough in terms of energy used or consumed and power demanded or consumed at a property 32 having a residence 34, which is the primary load of property 32. Primary meter 28 also includes a transceiver 35 for sending electrical or electricity usage and demand data to and receiving commands from controller 14 over long-haul communications network 26. In various embodiments, primary meter 28 also includes a controller or control system 31. The electricity or energy usage data measured by primary meter 28 is often used to calculate an electricity bill for property 32 over one or more intervals. The electricity demand data measured by primary meter is used to determine how much power is demanded or consumed by property 32 at any given time.

Primary meter 28 is shown here as monitoring the entire load for a property, but could also meter any energy and power further downstream. As a non-limiting example, primary meter 28 could be configured to meter only the energy used and power demanded by residence 34, but not a garage (not shown) on property 32. As another non-limiting example, primary meter 28 could be configured to meter a particular circuit within residence 34 that includes multiple loads or a single load. In addition, primary meter 28 is shown outside of residence 34, but may also be positioned within residence 34. As a non-limiting example, primary meter 28 could be a metered circuit breaker for residence 34. While property 32 is shown as a residential property including residence 34, property 32 may be a commercial property or another type of property having other types of buildings or facilities such as, for example, offices, restaurants, stores, movie theaters, or any other facilities that require electricity from electrical system 10.

In the illustrated embodiment, residence 34 includes three secondary or sub-loads 36, 38, 40 downstream from primary meter 28. Secondary loads 36, 38, 40 may include any type of applicable residential equipment, system, or circuit, such as, for example, an appliance like a refrigerator, an oven, a hot water heater, a dishwasher; a heating, ventilation, and air conditioning (HVAC) system; or a lighting system. In various embodiments, secondary load 40, for example, may be a smart load including a sub-meter or metering device 42 associated therewith and having at least one sensor 44 for measuring or sensing the amount of electricity flowing therethrough in terms of energy usage and power demanded by secondary load 40. Sub-meter 42 also includes a transceiver 48 for sending the measured electrical or electricity flow data to and receiving commands from master controller 14 over long-haul communications network 26 or from controller 31 of primary meter 28 or controller 23 of transformer 20.

Sub-meter 42 may be integrated with secondary load 40 or may be a separate device positioned at a different location than load 40. As a non-limiting example, sub-meter 42 may be located outside of residence 34 with primary meter 28. In addition, in various embodiments, sub-meter 42 may be a demand response or load management device, such as, for example, a load control relay, that controls when electricity may flow to secondary load 40. It is recognized that secondary loads 36, 38, 40 illustrated in FIG. 1 are for illustrative purposes only and that a greater or lesser number of smart or non-smart loads could be present in residence 34.

As shown in FIG. 1, the utility customer at residence 34 is stealing electricity by bypassing primary meter 28 with an electrical or bypass line 50. Bypass 50 effectively shunts primary meter 28 by directly connecting an electrical or circuit path or line 52 of power distribution network 18 of the utility and an electrical or circuit path or line 54 of residence 34. By shunting around primary meter 28, the utility customer at residence 34 prevents primary meter 28 from reading the full amount of electricity flowing to residence 34, which will result in a lower electric bill for the customer. While bypass 50 is shown in FIG. 1 as connected between transformer 20 and primary meter 28 and between primary meter 28 and residence 34, bypass 50 may be connected in any manner to shunt primary meter 28 such as, for example, on the other side of transformer 20 or even entirely within a housing (not shown) of primary meter 28. In addition, another method of electricity theft may be used instead of bypass 50.

Figure 2:
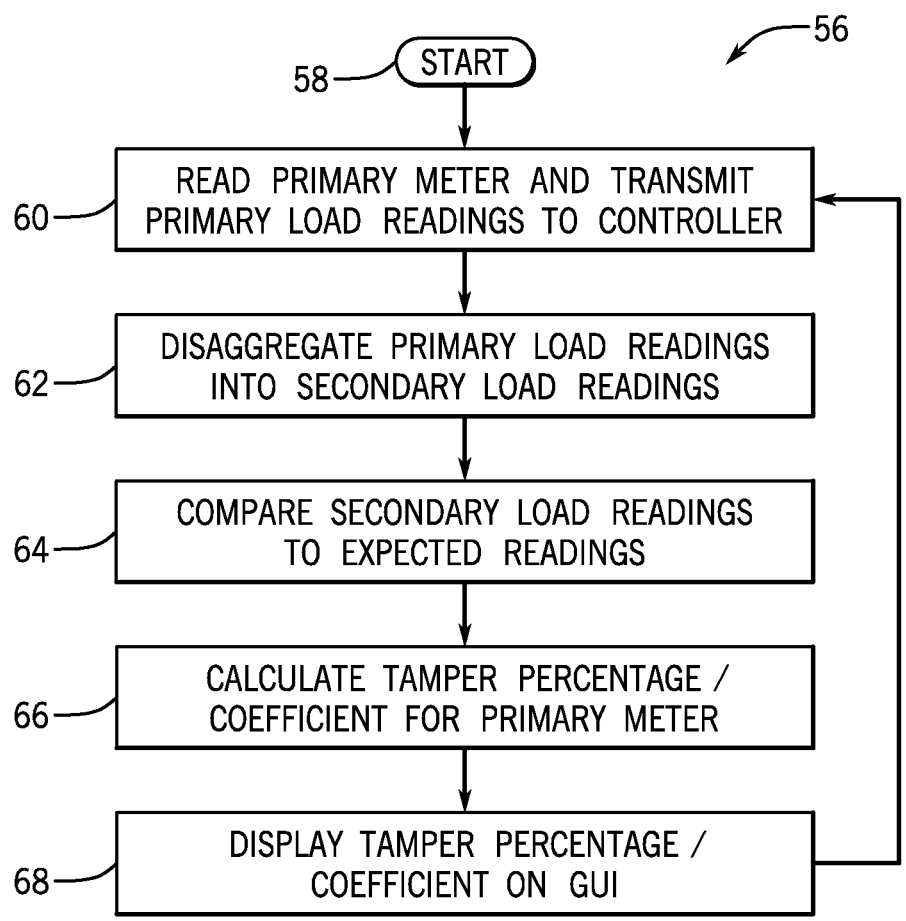
FIG. 2 is a flowchart illustrating a technique for detecting electricity theft in the power distribution system of FIG. 1, according to an embodiment of the invention.

As described in more detail with respect to FIG. 2, bypass 50 may be detected without having to physically inspect primary meter 28. This may be done by disaggregating the electrical data measured by primary meter 28 using controller 14. In other words, controller 14 will break down the electrical data of primary meter 28 to determine what types of secondary loads 36, 38, 40 are present within residence 34 and how much energy and/or power is being consumed by each secondary load 36, 38, 40. Controller 14 disaggregates the electrical data by identifying statistical patterns in the electrical data that correspond to different types of loads. For example, the electrical data measured for a refrigerator will have a different pattern than that measured for an oven or a dish washer, so the electrical data for each of the appliances may be separated to show how much energy and/or power each appliance is consuming.

Once secondary loads 36, 38, 40 have been identified, the disaggregated data for secondary loads 36, 38, 40 can be used to determine whether the energy usage and/or power demanded by secondary loads 36, 38, 40 has fallen below expected or anticipated levels. In other words, controller 14 analyzes the disaggregated data to determine whether there are any discrepancies or conflicts between the electrical data measured by primary meter 28 and typical electrical data for the secondary loads. This analysis performed by controller 14 may also detect when bypass 50 is installed ahead of the disaggregation because, in that case, all loads would appear to be using less than expected amounts of electricity. While controller 14 is described above as performing the data disaggregation of the electrical data gathered by primary meter 28 and the analysis thereof, controller 31 of primary meter 28 may also perform the electrical data disaggregation and analysis and alert the utility of any discrepancies via transceiver 35 and long-haul communications network 26. Controller 23 of transformer 20 may additionally be used to perform the electrical data disaggregation and analysis after receiving the data from primary meter 28 under various circumstances.

Referring now to FIG. 2, and with reference back to FIG. 1, a technique or process 56 for detecting the electricity theft at property 32 and, more specifically, residence 34 is shown with process 56 being performed by a controller or control system in or associated with the utility, such as controller 14 of station 12 of the utility. Process 56 will be described below with respect to readings at primary meter 28 with the analysis of the readings being performed by controller 14. However, as described above, the analysis of the readings at primary meter 28 may instead be performed by controller 31 of primary meter 28 or controller 23 of transformer 20, with the results of the analysis being transmitted to controller 14. Process 56 may be used to monitor the energy consumption and/or power demand data obtained by primary meter 28 only, obtained by primary meter 28 and any sub-meters 42 included in residence 34, or obtained by sub-meters 42 only. However, process 56 will be described below as though no sub-meters 42 are present within residence 34.

Process 56 begins at STEP 58 when electricity is provided to property 32 and residence 34 through transformer 20 and primary meter 28 and at least one electricity flow reading has been taken by primary meter 28. At STEP 60, primary meter reads the electricity usage and demand for property 32. The readings taken by primary meter 28 may occur over the course of one interval and be transmitted to controller 14 such that controller 14 monitors or analyzes the flow of electricity over that interval. However, controller 14 may also analyze usage data collected over multiple intervals in order to calculate demand over different intervals and to watch for changes in demand as secondary loads 36, 38, 40 turn on and off. That way controller 14 may incorporate historical data processing to present more complete and accurate results.

At STEP 62, controller 14 disaggregates the electrical readings from primary meter 28 into electrical readings for secondary loads 36, 38, 40. In doing so, controller 14 identifies the types of secondary loads 36, 38, 40 within residence 34 and how much energy and/or power is being consumed by each secondary load 36, 38, 40. In addition to the electrical readings from primary meter 28, controller 14 may also have access to background information on residence 34 and secondary loads 36, 38, 40 therein to assist in determining what types of loads are within residence 34. When performing data disaggregation, it is best to use shorter intervals because then more types of secondary loads can be identified. For example, when using intervals of 1 hour to 15 minutes, controller 14 may only be able to identify general load categories. However, if intervals between 1 minute and 1 second are used, controller 14 may be able to identify loads such as, for example, refrigerators, air conditioners, heaters, pool pumps, washers, dryers, etc. Controller 14 may additionally be able to identify smaller loads like toasters and computers in the 10 kHz-15 kHz interval range and may even differentiate between two different lights using intervals above 1 MHz. Thus, process 56 will generally operate using intervals less than 15 minutes, but will be most effective when using intervals no greater than 1 minute.

At STEP 64, after the electrical readings from primary meter 28 have been disaggregated into electrical readings for secondary loads 36, 38, 40, the electrical readings for secondary loads 36, 38, 40 are compared to expected or anticipated electrical readings for secondary loads 36, 38, 40. This comparison can include a number of different comparisons depending on the preference of the utility and the availability of information related to the typical energy usage and/or power demand of specific loads. For example, in various non-limiting embodiments, changes in power demand for secondary loads 36, 38, 40 may be compared to changes in power demand for secondary loads 36, 38, 40 sensed by primary meter 28 during previous intervals; to information in a database including typical power demand for a variety of loads such as, for example, appliances, HVAC systems, lighting systems, circuits, etc; and/or to background data available for residence 34 and secondary loads 36, 38, 40 such as, for example, known load values for secondary loads 36, 38, 40. In various other non-limiting embodiments, the energy used by secondary loads 36, 38, 40 may be compared to energy used by secondary loads 36, 38, 40 as measured by primary meter 28 during previous intervals; to information in a database including typical energy usage for a variety of loads such as, for example, appliances, HVAC systems, lighting systems, circuits, etc; and/or to background data available for residence 34 and secondary loads 36, 38, 40 such as, for example, known load values for secondary loads 36, 38, 40. However, in some embodiments, the comparison may include all of the above-described comparisons of power demand and energy usage or various combinations thereof.

Based on the comparison of the actual/disaggregated electrical readings for secondary loads 36, 38, 40 to the expected electrical readings for secondary loads 36, 38, 40, controller 14 calculates a bypass, interference, or tamper percentage or coefficient for primary meter 28 at STEP 66. The tamper percentage or coefficient indicates a level of bypass, tampering, or interference with electrical path 52 through primary meter 28 and may be calculated using a variety of methods such as, for example, linear regression. Controller 14 is generally configured or programmed to display a tamper percentage as a percentage of tampering and to display a tamper coefficient as a number between 0 and 1 proportional to the amount of tampering. For example, in non-limiting embodiments, a tamper percentage of 20% would indicate that the utility customer has stolen 20% of the electricity used at residence 34, and a tamper coefficient of 0.8 would indicate the same. Thus, if no tampering is detected by controller 14 (in other words, no or a minimum number of discrepancies are detected by controller 14 between the actual and expected values of the electrical data for secondary loads 36, 38, 40), the tampering coefficient should be close to 1 and the tampering percentage should be close to 0%. However, tamper percentages and coefficients may be displayed according to any desired format.

In calculating the tamper percentage/coefficient, controller 14 generally has specific rules for interpreting any discrepancies between the disaggregated electrical data for secondary loads 36, 38, 40 and the expected electrical data. As a non-limiting example, controller 14 may only be configured to determine that primary meter 28 has been tampered with if a difference between the disaggregated and expected electrical data is above a predetermined threshold. In other words, if a conflict between the disaggregated and expected electrical data for secondary loads 36, 38, 40 is minor, then controller 14 will characterize that minor conflict as being within a normal range.

In addition, in various non-limiting embodiments, controller 14 may only be configured to determine that primary meter 28 has been bypassed if the electrical data appears to show less energy and/or power has been consumed by all secondary loads 36, 38, 40. However, in other non-limiting embodiments, controller 14 is programmed to indicate a level of tampering in the tamper coefficient/percentage if only one of secondary loads 36, 38, 40 seems to be consuming less energy and/or power. Further, in various other embodiments, controller 14 may be configured to calculate the tamper coefficient/percentage based on percentages or ranges of percentages of the expected electrical data for secondary loads 36, 38, 40. As a non-limiting example, controller 14 may be configured to determine a tamper percentage of 10% if the disaggregated electrical data is 10% less than the expected electrical data.

Regardless of how controller calculates the tamper coefficient/percentage, controller 14 outputs the tamper coefficient and/or percentage to a display at STEP 68 once the calculation has been completed. The display may be in any form advantageous to the utility such as, for example, a GUI (not shown) at master station 12 of the utility. By displaying the tamper coefficient and/or percentage at the utility, controller 14 alerts employees of the utility that property 32 needs to be examined or inspected to fix the bypass of primary meter 28. Controller 14 will continue to output the tamper coefficient and/or percentage to the utility indicating the bypass of primary meter 28 until bypass 50 positioned around primary meter 28 has been removed. Once bypass 50 has been removed, the tamper coefficient/percentage would change to values more favorable to the utility. After controller 14 alerts the utility of the bypass, process 56 proceeds back to STEP 60 to continue monitoring for electricity theft at property 32.

As stated above, process 56 may also be performed when load 40 includes sub-meter 42. The electrical data sensed by sub-meter 42 may or may not be used in process 56, depending on the circumstances and preference of the utility. In various non-limiting embodiments, controller 14 may be configured to perform process 56 without the electrical data from sub-meter 42 and instead use the electrical data from sub-meter 42 in a separate process. In other various non-limiting embodiments, controller 14 may compare the electrical data of secondary load 40 after disaggregation at STEP 62 to the electrical data from sub-meter 42 at STEP 64 in order to determine whether there are any discrepancies between the disaggregated electrical data of secondary load 40 and electrical data measured by sub-meter 42. In still other non-limiting embodiments, controller 14 may eliminate the analysis of secondary load 40 from process 56 since secondary load 40 is already being monitored by sub-meter 42.

In addition, while process 56 is described above as being implemented by controller 14 of station 12, in various embodiments, process 56 may be performed in whole or in part by a cloud-based controller or a remote controller, as noted above with respect to FIG. 1. As a non-limiting example, in one embodiment, AMI data could be transmitted to a third party for disaggregation. In other various non-limiting embodiments, the controller is cloud-based or integrated directly with a cloud-based platform to form disaggregation and analysis.

Beneficially, embodiments of the invention thus provide a system for detecting electricity theft. The system includes a controller that receives electricity usage and demand data from a primary meter for a primary load and disaggregates that electricity usage and demand data into electricity usage and demand data for secondary loads within the primary load. The controller compares the disaggregated electricity usage and demand data to expected electricity usage and demand data based on the types of secondary loads identified during the data disaggregation. Based on the comparison of the disaggregated and expected electricity usage and demand data, the controller calculates a tamper percentage and/or coefficient for the primary meter indicating a level of interference with an electrical line through the primary meter to the primary load. If a discrepancy exists between the disaggregated and expected electricity usage and/or demand data, the tamper percentage and/or coefficient will indicate a percentage that the primary meter has been bypassed by a utility customer to reduce the electric utility bill.

According to one embodiment of the present invention, a system for detecting theft of electricity from a utility includes a controller configured to receive electricity readings from a metering device configured to sense electricity flowing therethrough to a primary load, disaggregate the electricity readings from the metering device into electricity readings for sub-loads identified within the primary load, and compare the disaggregated electricity readings for the identified sub-loads to expected electricity readings for each identified sub-load. The controller is also configured to calculate a level of interference with an electrical path through the metering device based on an extent that the disaggregated electricity readings deviate from the expected electricity readings and output to the utility the level of interference with the electrical path.

According to another embodiment of the present invention, a method of detecting theft of electricity includes acquiring electrical data for a primary load using a primary meter, transmitting the electrical data from the primary meter to a controller, and disaggregating the electrical data with the controller to identify secondary loads present within the primary load and to separate the electrical data corresponding to each secondary load. The method further includes analyzing the disaggregated electrical data with the controller to detect if the disaggregated electrical data for any of the secondary loads conflicts with anticipated electrical data corresponding to the types of secondary loads identified. In addition, the method includes assessing with the controller an extent of tampering with an electrical line through the primary meter to the primary load based on the analysis and outputting the extent of the tampering with the electrical line to a display.

According to yet another embodiment of the present invention, a power system having electrical theft detection capabilities includes a primary meter configured to measure a flow of electricity through an electrical path from an electric utility to a primary load and a control system for detecting theft of electricity. The control system configured to retrieve the electricity flow measurements of the primary meter and identify secondary loads within the primary load by disaggregating the electricity flow measurements of the primary meter. The control system is additionally configured to determine electricity flow measurements for each secondary load using the disaggregated electricity flow measurements and compare the disaggregated electricity flow measurements for each secondary load to expected electricity flow measurements based on secondary load type. Furthermore, the control system is configured to calculate a percentage of electricity that has bypassed the primary meter before being delivered to the primary load based on the comparison of the disaggregated secondary load electricity flow measurements to the expected electricity flow measurements and display the percentage on a graphical user interface.

The present invention has been described in terms of the preferred embodiment, and it is recognized that equivalents, alternatives, and modifications, aside from those expressly stated, are possible and within the scope of the appending claims.

What is claimed is:

1. A system for detecting theft of electricity from a utility, the system comprising a controller configured to:
   receive electricity readings from a metering device configured to sense electricity flowing therethrough to a primary load;
   disaggregate the electricity readings from the metering device to separate the electricity readings for the primary load into electricity readings for sub-loads identified within the primary load, wherein the disaggregated electricity readings collectively total the electricity readings for the primary load;
   compare the disaggregated electricity readings for the identified sub-loads to expected electricity readings for each identified sub-load;
   calculate a level of interference with an electrical path through the metering device based on an extent that the disaggregated electricity readings deviate from the expected electricity readings; and
   output to the utility the level of interference with the electrical path.

2. The system of claim 1 wherein the controller is configured to use linear regression to calculate the level of interference with the electrical path.

3. The system of claim 1 wherein the controller is configured to output the level of interference with the electrical path as an interference coefficient equal to a value between 0 and 1.

4. The system of claim 1 wherein the controller is configured to output the level of interference with the electrical path to the utility on a graphical user interface.

5. The system of claim 1 wherein the controller is configured to compare the disaggregated electricity readings for each sub-load to their associated expected electricity readings over multiple intervals.

6. The system of claim 1 wherein the controller is configured to receive the electricity readings over intervals no greater than one minute.

7. The system of claim 1 wherein the controller is configured to receive the electricity readings over either intervals of approximately 1 hour in length or approximately 15 minutes in length.

8. The system of claim 1 wherein the expected electricity readings are based on a range of normal electricity readings for types of sub-loads identified.

9. The system of claim 1 wherein the controller is configured to:
disaggregate the electricity readings from the metering device into power demand readings for each identified sub-load; and
compare changes in the power demand readings to an expected change power demand for each identified sub-load.

10. A method of detecting theft of electricity comprising:
acquiring electrical data for a primary load using a primary meter;
transmitting the electrical data from the primary meter to a controller;
disaggregating the electrical data with the controller to identify secondary loads present within the primary load and to separate the electrical data corresponding to each secondary load, wherein a combination of all the disaggregated electrical data is equal to the electrical data for the primary load;
analyzing the disaggregated electrical data with the controller to detect if the disaggregated electrical data for any of the secondary loads conflicts with anticipated electrical data corresponding to the types of secondary loads identified;
assessing with the controller an extent of tampering with an electrical line through the primary meter to the primary load based on the analysis; and
outputting the extent of the tampering with the electrical line to a display.

11. The method of claim 10 wherein assessing the extent of the tampering with the electrical line comprises computing a tamper percentage indicating a percentage that the primary meter has been bypassed.

12. The method of claim 11 wherein computing the tamper percentage includes computing a linear regression slope based on the analysis.

13. The method of claim 9 wherein analyzing the disaggregated electrical data comprises comparing changes in power demand in the disaggregated electrical data for each secondary load to anticipated changes in power demand for each identified secondary load.

14. The method of claim 9 wherein analyzing the disaggregated electrical data comprises comparing electricity usage data disaggregated for each secondary load to anticipated electricity usage for each identified secondary load.

15. A power system having electrical theft detection capabilities, the power system comprising:
a primary meter configured to measure a flow of electricity through an electrical path from an electric utility to a primary load;
a control system for detecting theft of electricity, the control system configured to:
retrieve the electricity flow measurements of the primary meter;
identify secondary loads within the primary load by disaggregating the electricity flow measurements of the primary meter, wherein a combination of all the disaggregated electricity flow measurements totals the electricity flow measurements of the primary meter;
separate the disaggregated electricity flow measurements into electricity flow measurements for each secondary load;
compare the disaggregated electricity flow measurements for each secondary load to expected electricity flow measurements based on secondary load type;
calculate a percentage of electricity that has bypassed the primary meter before being delivered to the primary load based on the comparison of the disaggregated secondary load electricity flow measurements to the expected electricity flow measurements; and
display the percentage on a graphical user interface.

16. The power system of claim 15 wherein the control system is further configured to:
determine electricity usage data for each secondary load based on the disaggregated electricity flow measurements;
compare the electricity usage data for each secondary load to expected electricity usage data based on secondary load type; and
calculate the percentage of electricity that has bypassed the primary meter based on the comparison of the secondary load electricity usage data to the expected electricity usage data.

17. The power system of claim 15 wherein the control system is further configured to:
determine power demand data for each secondary load based on the disaggregated electricity flow measurements;
compare the power demand data for each secondary load to expected power demand data based on secondary load type; and
calculate the percentage of electricity that has bypassed the primary meter based on the comparison of the secondary load power demand data to the expected power demand data.

18. The power system of claim 15 wherein the control system is configured to retrieve the electricity flow measurements of the primary meter over intervals less than or equal to one minute.

19. The power system of claim 15 wherein the expected electricity flow measurements comprises at least one of information from a database including typical electricity flow measurements for secondary loads and previous disaggregated electricity flow measurements for the secondary loads.

20. The power system of claim 15 further comprising a secondary meter configured to measure a flow of electricity to one of the secondary loads within the primary load; and
wherein the control system is configured to compare the disaggregated electricity flow measurements for the secondary load metered by the secondary meter to the electricity flow measurements of the secondary meter.

* * * * *